(12) United States Patent
Park et al.

(10) Patent No.: US 10,921,536 B2
(45) Date of Patent: Feb. 16, 2021

(54) HEAT SINK FOR OPTICAL TRANSCEIVER

(71) Applicant: Arista Networks, Inc., Santa Clara, CA (US)

(72) Inventors: Youngbae Park, Santa Clara, CA (US); Jiayi Wu, Santa Clara, CA (US); Robert Wilcox, Santa Clara, CA (US); Richard Hibbs, Santa Clara, CA (US); Xin Xue, Santa Clara, CA (US)

(73) Assignee: Arista Networks, Inc., Santa Clara, CA (US)

( * ) Notice: Subject to any disclaimer, the term of this patent is extended or adjusted under 35 U.S.C. 154(b) by 0 days.

(21) Appl. No.: 15/599,272

(22) Filed: May 18, 2017

(65) Prior Publication Data

US 2018/0338387 A1  Nov. 22, 2018

(51) Int. Cl.
*G02B 6/42* (2006.01)
*H05K 7/20* (2006.01)

(52) U.S. Cl.
CPC ......... *G02B 6/4284* (2013.01); *G02B 6/4269* (2013.01); *G02B 6/428* (2013.01);
(Continued)

(58) Field of Classification Search
CPC ....... G06F 1/181–182; H05K 7/20218–20381; H05K 7/20409–20418; H05K 7/20009–202; H05K 7/20145; H05K 7/2039; H01L 23/367–3677; H01L 23/473; H01L 23/46–467; G02B 6/4269; G02B 6/4284; G02B 6/428; G02B 6/4266–4273; H01R 13/6581; H01R 24/28; H01R 24/64; H01R 25/006; H01R 2107/00

USPC ...... 361/676–678, 679.46–679.54, 688–723, 361/699–704, 709–710, 719–721; 165/80.1–80.5, 104.33, 185; 174/15.1–15.3, 16.1–16.3, 547, 548; 257/712–722, E23.088; 24/453, 458–459; 454/184; 312/236

See application file for complete search history.

(56) References Cited

U.S. PATENT DOCUMENTS 4,730,232 A * 3/1988 Lindberg ............ H01L 25/0652
257/E25.011
5,812,374 A * 9/1998 Shuff .................. H05K 7/20545
165/185

(Continued)

OTHER PUBLICATIONS

OSFP Adapter Transceiver—Google Scholar, 2 pages, 2017.
(Continued)

*Primary Examiner* — Zachary Pape
(74) *Attorney, Agent, or Firm* — Fountainhead Law Group PC

(57) ABSTRACT

An electronics module is provided. The electronics module includes a housing at least partially enclosing a first printed circuit board configured to couple the electronics module to a connector attached to a second printed circuit board. The electronics module includes a first heat sink disposed along a first surface of the housing and a second heat sink disposed along a second surface of the housing. One or more notches or apertures of the first printed circuit board are proximate to the connector thereby enabling an airflow through the second heat sink along the second surface of the housing to exhaust over a surface of the connector with an airflow through the first heat sink.

20 Claims, 6 Drawing Sheets

(52) U.S. Cl.
CPC ..... *H05K 7/20145* (2013.01); *H05K 7/20163* (2013.01); *H05K 7/20409* (2013.01); *H05K 7/20418* (2013.01)

(56) References Cited

U.S. PATENT DOCUMENTS

| | | | |
|---|---|---|---|
| 6,055,157 A * | 4/2000 | Bartilson | H01L 23/427 165/80.4 |
| 6,276,963 B1 | 8/2001 | Avery et al. | |
| 6,650,019 B2 * | 11/2003 | Glenn | H01L 25/0657 257/686 |
| 6,992,888 B1 * | 1/2006 | Iyer | H01L 23/3732 165/80.4 |
| 7,070,444 B2 | 7/2006 | Sato et al. | |
| 7,070,446 B2 | 7/2006 | Henry et al. | |
| 7,256,992 B1 * | 8/2007 | Stewart | G06F 1/20 165/80.3 |
| 7,408,782 B2 * | 8/2008 | Austin | H05K 7/1404 361/716 |
| 7,845,975 B2 | 12/2010 | Cheng et al. | |
| 7,934,959 B2 | 5/2011 | Rephaeli et al. | |
| 8,197,282 B1 | 6/2012 | Su et al. | |
| 8,545,268 B2 | 10/2013 | Fogg et al. | |
| 9,042,096 B2 | 5/2015 | Thomas et al. | |
| 9,246,280 B2 | 1/2016 | Neer et al. | |
| 9,252,538 B2 | 2/2016 | Recce et al. | |
| 9,341,794 B1 | 5/2016 | Curtis et al. | |
| 9,509,102 B2 * | 11/2016 | Sharf | H05K 7/20436 |
| 9,793,667 B1 | 10/2017 | Park et al. | |
| 9,877,413 B2 * | 1/2018 | Regnier | H05K 7/20418 |
| 9,929,500 B1 | 3/2018 | Ista | |
| 9,935,403 B1 * | 4/2018 | Briant | H05K 9/0058 |
| 10,073,230 B2 * | 9/2018 | Wilcox | G02B 6/4261 |
| 10,164,362 B2 * | 12/2018 | Little | G02B 6/4269 |
| 10,249,983 B2 | 4/2019 | Regnier et al. | |
| 10,411,423 B1 | 9/2019 | Park et al. | |
| 10,651,607 B1 | 5/2020 | Gawlowski | |
| 2002/0025720 A1 | 2/2002 | Bright et al. | |
| 2002/0135981 A1 * | 9/2002 | Pautsch | H01L 23/4735 361/700 |
| 2002/0197043 A1 | 12/2002 | Hwang | |
| 2005/0201055 A1 * | 9/2005 | Jyo | H05K 7/202 361/695 |
| 2006/0003632 A1 | 1/2006 | Long | |
| 2006/0228079 A1 | 10/2006 | Tamanuki et al. | |
| 2008/0024996 A1 * | 1/2008 | Jacobson | H05K 7/026 361/714 |
| 2008/0137306 A1 * | 6/2008 | Kim | H05K 9/0058 361/709 |
| 2008/0253086 A1 * | 10/2008 | Schultz | H05K 7/20545 361/690 |
| 2008/0299826 A1 | 12/2008 | Cheng | |
| 2009/0109627 A1 | 4/2009 | Murr et al. | |
| 2009/0251867 A1 | 10/2009 | Sharma et al. | |
| 2010/0008025 A1 * | 1/2010 | Nemoz | H05K 7/20563 361/678 |
| 2010/0134981 A1 * | 6/2010 | Whittum | H05K 7/20354 361/715 |
| 2011/0044006 A1 * | 2/2011 | Kim | H05K 9/0058 361/715 |
| 2011/0080701 A1 * | 4/2011 | Bisson | H05K 7/20563 361/679.5 |
| 2011/0106997 A1 | 5/2011 | Romero et al. | |
| 2011/0225341 A1 | 9/2011 | Satoh | |
| 2012/0014063 A1 * | 1/2012 | Weiss | H05K 7/20163 361/697 |
| 2012/0071011 A1 | 3/2012 | Kagan et al. | |
| 2012/0254495 A1 | 10/2012 | Tang et al. | |
| 2012/0281361 A1 * | 11/2012 | Gunderson | H05K 5/0256 361/707 |
| 2012/0300407 A1 * | 11/2012 | Yamamoto | G02B 6/4201 361/715 |
| 2013/0164970 A1 | 6/2013 | Regnier et al. | |
| 2013/0215936 A1 | 8/2013 | Tang et al. | |
| 2013/0251025 A1 | 9/2013 | Smith | |
| 2013/0251052 A1 | 9/2013 | Tang et al. | |
| 2013/0258601 A1 * | 10/2013 | Qin | H05K 7/2049 361/714 |
| 2013/0272348 A1 | 10/2013 | Lai et al. | |
| 2014/0003448 A1 | 1/2014 | Peng et al. | |
| 2014/0016270 A1 * | 1/2014 | Bonkohara | H01L 23/34 361/699 |
| 2014/0075749 A1 * | 3/2014 | Baska | H05K 1/0216 29/830 |
| 2014/0154912 A1 | 6/2014 | Hirschy | |
| 2014/0248059 A1 | 9/2014 | Tang et al. | |
| 2014/0321061 A1 | 10/2014 | Moore et al. | |
| 2014/0355211 A1 * | 12/2014 | Patil | H05K 1/0201 361/695 |
| 2015/0086211 A1 | 3/2015 | Coffey et al. | |
| 2015/0092354 A1 * | 4/2015 | Kelty | H05K 7/20563 361/722 |
| 2015/0093073 A1 | 4/2015 | Wright | |
| 2015/0186319 A1 | 7/2015 | Blevins et al. | |
| 2015/0208550 A1 * | 7/2015 | Rugg | H05K 7/20518 361/713 |
| 2015/0216077 A1 * | 7/2015 | Tanaka | H02M 7/003 361/697 |
| 2015/0261266 A1 * | 9/2015 | Dean | G06F 1/20 361/679.46 |
| 2015/0342084 A1 * | 11/2015 | Dorenkamp | H05K 7/2089 361/720 |
| 2016/0109668 A1 | 4/2016 | Pfnuer et al. | |
| 2016/0134951 A1 | 5/2016 | Mills | |
| 2016/0174415 A1 | 6/2016 | Ito et al. | |
| 2016/0192044 A1 | 6/2016 | Raza et al. | |
| 2016/0252691 A1 | 9/2016 | Arekar et al. | |
| 2016/0342563 A1 | 11/2016 | Tomada | |
| 2017/0040745 A1 | 2/2017 | Phillips et al. | |
| 2017/0077643 A1 * | 3/2017 | Zbinden | G02B 6/4268 |
| 2017/0133777 A1 * | 5/2017 | Little | H01R 12/716 |
| 2017/0133794 A1 * | 5/2017 | Hinkle | H01R 13/6581 |
| 2018/0041280 A1 | 2/2018 | Elahmadi et al. | |
| 2018/0188465 A1 | 7/2018 | Zer et al. | |
| 2019/0108161 A1 | 4/2019 | Nagarajan | |

OTHER PUBLICATIONS

QSFP QSFP Adapter—Google Scholar, 2, page, 2017.
OSFP Adapter Connectors in Transceivers—Google Scholar, 2 pages, 2017.
OSFP Adapter Connectors Transceivers, 2 pages, 2017.
"What are you looking for?", InnovationQ Plus-IP.com, https://iq.ip.com/discover, 1 page (2019).

* cited by examiner

HEAT SINK FOR OPTICAL TRANSCEIVER

BACKGROUND

Network devices are using optical cable to deliver faster and more reliable communication. An optical pluggable module is a transceiver module that has one end connected to an optical cable, electronics that translate the optical signal into an electronic signal, and another end plugged into a network device that will process the electronic signal. A coaxial pluggable module is similar, but applies to coaxial cable. There are multiple standardized optical (and coaxial) pluggable module form factors. Using modules with standardized form factors, network devices can be configured for different optical (or coaxial) cables and different performance capabilities in a convenient, well accepted, industry-favored manner. Examples of pluggable module form factors include SFP (small form factor pluggable), QSFP (quad small form factor pluggable) and OSFP (octal small form factor pluggable, or octal small format pluggable) for optical cable, and CXP (CoaXPress) for coaxial cable. As the processing speeds of the devices increase and the volume designated for components and packaging remains limited, the optical module is becoming more and more power dense, and cooling of the module (and electronics in the module) becomes more critical. Many systems attempt to incorporate a single heat sink with forced air flow, for thermal cooling of the optical module. Geometrical restrictions on the location of the heat sink within the optical module are obstacles that limit the cooling capacity and more uniform cooling. In addition, the electrical connector, which connects the optical module to the host PCA (Printed Circuit Assembly) prevents airflow to the bottom area, i.e., in the direction of the host PCA. Therefore, there is a need in the art for a solution which overcomes the drawbacks described above.

SUMMARY

In some embodiments, an electronics module is provided. The electronics module includes a housing at least partially enclosing a first printed circuit board configured to couple the electronics module to a connector attached to a second printed circuit board. The electronics module includes a first heat sink disposed along a first surface of the housing and a second heat sink disposed along a second surface of the housing. One or more notches or apertures of the first printed circuit board are proximate to the connector thereby enabling an airflow through the second heat sink along the second surface of the housing to exhaust over a surface of the connector with an airflow through the first heat sink.

In some embodiments, a method of managing airflow for an OSFP (octal small form factor pluggable) transceiver module is provided. The method includes directing a first airflow over a first heat sink that is disposed along a first surface of a housing of the OSFP transceiver module. The method includes directing a second airflow to a first end of a second heat sink that is disposed along a second surface of the housing of the OSFP transceiver module, with an edge connector of a first printed circuit board of the OSFP transceiver coupled to a connector that is attached to a second printed circuit board. The method includes directing the second airflow from a second end of the second heat sink through one or more notches of the first printed circuit board and directing the second airflow from the one or more notches of the first printed circuit board over a surface of the connector that is attached to the second printed circuit board.

Other aspects and advantages of the embodiments will become apparent from the following detailed description taken in conjunction with the accompanying drawings which illustrate, by way of example, the principles of the described embodiments.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

Various embodiments of an OSFP optical transceiver module described herein add an additional heat sink at the bottom of the module and add notches or apertures to module members for passing a bottom airflow over the additional heat sink. The transceiver module plugs into a connector attached to a printed circuit board (PCB), and the notches or apertures direct the bottom airflow from the bottom heat sink out over a surface of the connector that would otherwise block the bottom airflow. These features could be adapted to other electronics modules, in further embodiments and are not limited to an optical transceiver. Orientation terms used herein, such as "top", "bottom", "front", "upper", "lower", etc. should be considered as relative to embodiments of electronics modules, rather than absolute with respect to gravity, as the modules may be installed in various orientations in equipment at various positions and have airflows directed relative to those orientations.

Embodiments of the OSFP transceiver module described herein dissipate more heat more efficiently. Semiconductors continually shrinking and becoming faster, and the denser arrangements of electronics are dissipating more heat in smaller spaces. Embodiments of the OSFP transceiver module described below improve thermal management inside the module. Dissipating heat only to the top side of a module requires hot components to be placed near the top of the module. There are cases where a hot component is placed near the bottom of the module, and would not have sufficient cooling in a module with only an upper heat sink, i.e. a single heat sink.

Figure 1:
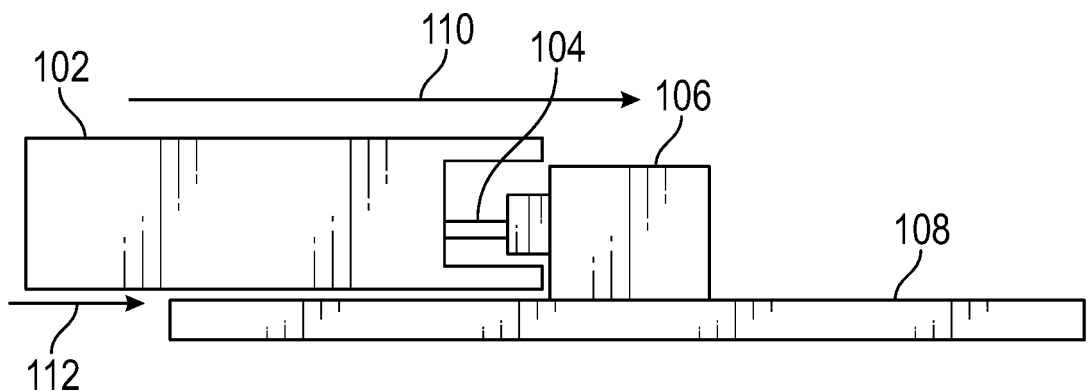
FIG. 1 is a side view of a transceiver module plugging into a connector that is attached to a printed circuit board.

FIG. 1 is a side view of a transceiver module 102 plugging into a connector 106 that is attached to a printed circuit board 108 (e.g., of a network device or network element such as a switch, router, server or other communication device), showing how the connector 106 blocks bottom airflow 112. The transceiver module 102 has a transceiver printed circuit board (PCB) 104 (or printed circuit assembly, PCA) that couples to the connector 106. Top airflow 110, i.e., airflow over or near the top of the transceiver module 102, readily proceeds over a top surface of the connector 106. Bottom airflow 112, i.e., airflow under or near the bottom of the transceiver module 102, is squeezed between the bottom of the transceiver module 102 and the printed circuit board 108 to which the connector 106 is attached, and is relatively unable to get past the connector 106 due to the coupling of printed circuit board 104 and connector 106. Because of these factors, many transceiver modules 102 have a heat sink at the top of the transceiver module 102, where a portion of a top airflow 110 is accessible to the heat sink and can cool the heat sink and electronics components from which the heat sink draws heat. Present embodiments of a transceiver module add a lower heat sink and airflow management for effective airflow to and from the lower heat sink despite presence of the connector 106, for additional cooling of electronic components. Notches or openings within opposing side surfaces of printed circuit board 104 enables air flow 112 to proceed over the top surface of connector 106 as described in more detail below.

Figure 2:
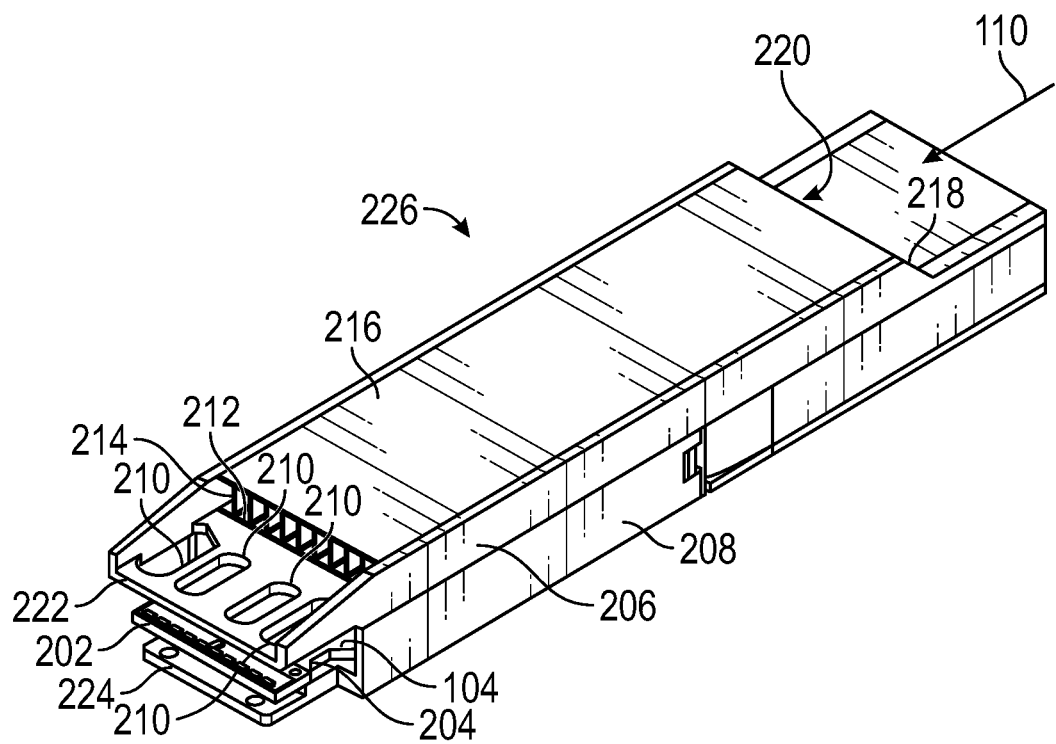
FIG. 2 is a perspective view of an octal small form factor pluggable (OSFP) transceiver module with airflow management in accordance with some embodiments.

FIG. 2 is a perspective view of an octal small form factor pluggable (OSFP) transceiver module 226 with airflow management in accordance with the present disclosure. Like many other transceiver modules, embodiments of the OSFP transceiver module 226 shown herein have an upper heat sink 212 with fins 214. Further embodiments without an upper heat sink, or with various heat sinks that have pins rather than fins, or a combination of fins and pins, as well as other suitable configurations, are readily devised. This embodiment of a transceiver module has a cover 216 to protect the fins 214 of the upper heat sink 212 and/or to direct airflow. The housing of the OSFP transceiver module 226 has an upper housing member 206 and a lower housing member 208. In this embodiment, the upper heat sink 212 with fins 214, and cover 216 are integrated with the upper housing member 206, as could be formed by extruding aluminum or other material, or building up from separate pieces to an assembly held together by fasteners, bonding, or combination thereof. An upper front lip 222 extends from the main body of the upper housing member 206, and protects an edge connector 202 of a printed circuit board 104 of the transceiver module from physical or electrical damage during handling, e.g., while the OSFP transceiver module 226 is not plugged in and protected by a chassis of a network device. Upper front lip is disposed over a portion of printed circuit board 104 that is not enclosed by the housing of the OSFP transceiver module 226. A lower front lip 224 extends from the lower housing member 208, and likewise protects the edge connector 202 from physical or electrical damage. The top airflow 110 enters an inlet 218 at one end of the OSFP transceiver module 226 and flows through channels 220 formed by the heat sink 212, fins 214 and cover 216, to cool the heat sink 212 and electronics that are within the OSFP transceiver module 226.

This embodiment of a transceiver module also has a lower heat sink (not shown in FIG. 2, but see FIGS. 3, 4 and 6) integral with or attached to the lower housing member 208. A bottom airflow cools the lower heat sink, and is routed up through one or more notches 204 of the transceiver module printed circuit board 104 and through one or more apertures 210 of the upper lip 222 of the upper housing member 206. This bottom airflow is then directed up and over, or otherwise past the connector 106 that is attached to the printed circuit board 108 (see FIG. 1). In some embodiments, the bottom airflow, after passing through the apertures 210 of the upper lip 222, joins the top airflow 110 that is exiting from the channels 220, and the combined airflow travels up and over or past the top of the connector 106. In further embodiments, the bottom airflow could exit to the sides of the housing, or a combination of the top and sides of the housing.

Figure 3:
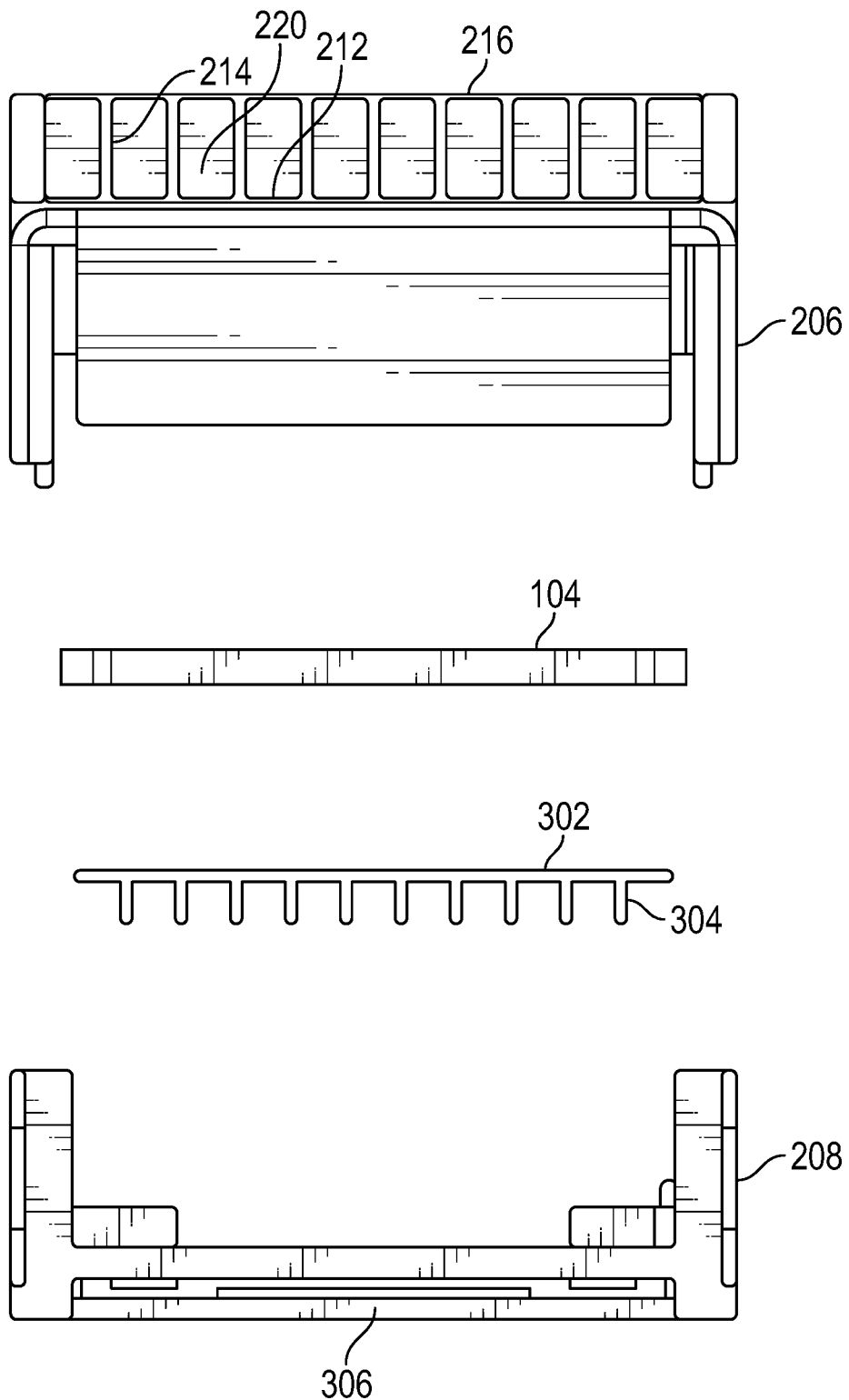
FIG. 3 is a cross-section end view of the OSFP transceiver module of FIG. 2, showing an upper housing member, an upper heat sink with fins, a printed circuit board, a lower heat sink with fins, and a lower housing member with a cover for the lower heat sink in accordance with some embodiments.

FIG. 3 is a cross-section end view of the OSFP transceiver module 226 of FIG. 2, showing an upper housing member 206, an upper heat sink 212 with fins 214, a printed circuit board 104, a lower heat sink 302 with fins 304, and a lower housing member 208 with a cover 306 for the lower heat sink 302. Channels 220, bounded by the cover 216, fins 214 and base of the heat sink 212 are seen as oriented perpendicular to the drawing. The printed circuit board 104 is readily populated with electronic circuits (not shown in the drawing) to perform the electronic functions of the transceiver module. The lower heat sink 302 and fins 304 are integral in this embodiment, as could be formed through extrusion, or are built up from separate pieces in further embodiments. The cover 306 for the lower heat sink 302 is formed from a separate piece and bonded, fastened, press-fitted to or otherwise assembled to the lower housing member 208, but could be integral with the lower housing member 208 in further embodiments. In some embodiments, thermal grease or other thermal coupling material is applied to the lower heat sink 302 and/or the printed circuit board 104, for heat transfer. Preferably, the upper heat sink 212 and the lower heat sink 302 are made of aluminum or other thermal-conductive material such as copper, steel, various alloys and composite materials, etc.

Figure 4:
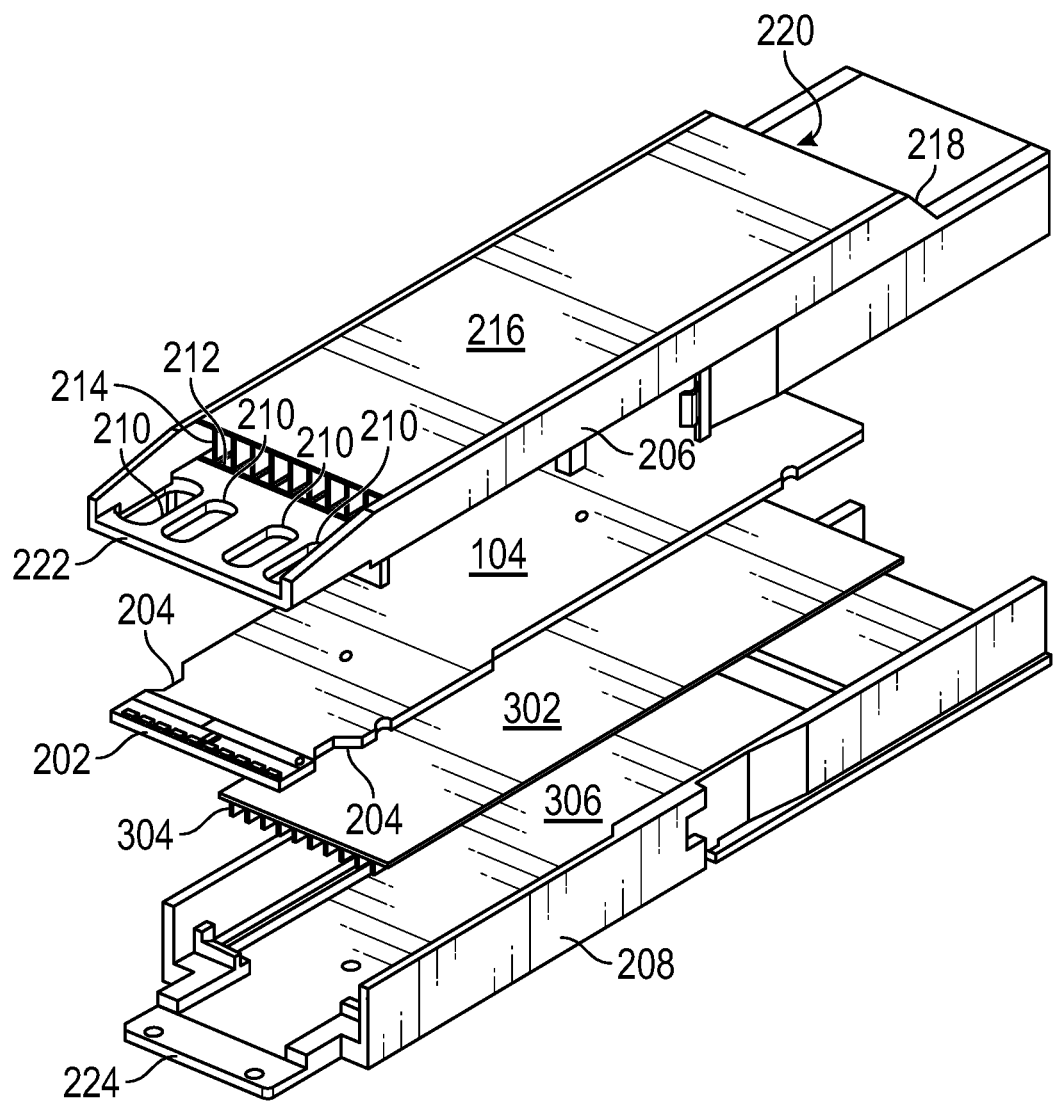
FIG. 4 is an exploded view of the OSFP transceiver module of FIGS. 2 and 3, showing a bottom airflow inlet and a bottom airflow outlet in accordance with some embodiments.

FIG. 4 is an exploded view of the OSFP transceiver module 226 of FIGS. 2 and 3, showing a bottom airflow inlet 402 and a bottom airflow outlet 404. A bottom airflow 112 (see FIG. 1) enters the OSFP transceiver module 226 through the bottom airflow inlet 402, flows through channels created or bounded by the lower heat sink 302, fins 304 of the lower heat sink 302, and the bottom cover 306, exiting at the bottom airflow outlet 404. The bottom airflow then passes through the notches 204 in the transceiver printed circuit board 104, through the apertures 210 of the upper lip 222 of the upper housing member 206 and out of the OSFP transceiver module 226. Notches 204, also referred to as openings or apertures, are defined on opposing side edges of printed circuit board 104. In this embodiment, the bottom airflow inlet 402 is an aperture through the lower housing member 208, bounded by one edge of the bottom cover 306 and edges of the lower housing member 208. For airflow management in further embodiments, a single aperture or notch can be replaced by multiple apertures and/or multiple notches, notches can be replaced by apertures, members can have more apertures, fewer apertures, more notches, fewer notches, a combination of notch(es) and aperture(s), apertures and/or notches could be located in other members, etc. In some embodiments without an upper lip 222, the bottom airflow exits the transceiver module after flowing past the notches 204 (and/or apertures in further embodiments) of the printed circuit board 104. Variations with taller or shorter walls for the upper housing member 206 and lower housing member 208, one of these members having walls and the other not having walls, larger or fewer numbers of components, more or fewer heat sinks, etc., are readily devised in keeping with the teachings herein. For instance, one embodiment could have just the lower heat sink 302, another embodiment could have heat sinks on the sides of the transceiver module, and yet another embodiment could have the housing and heat sink(s) extruded as a single, unitary body. Multiple printed circuit boards 104 may be integrated with the embodiments.

Figure 5:
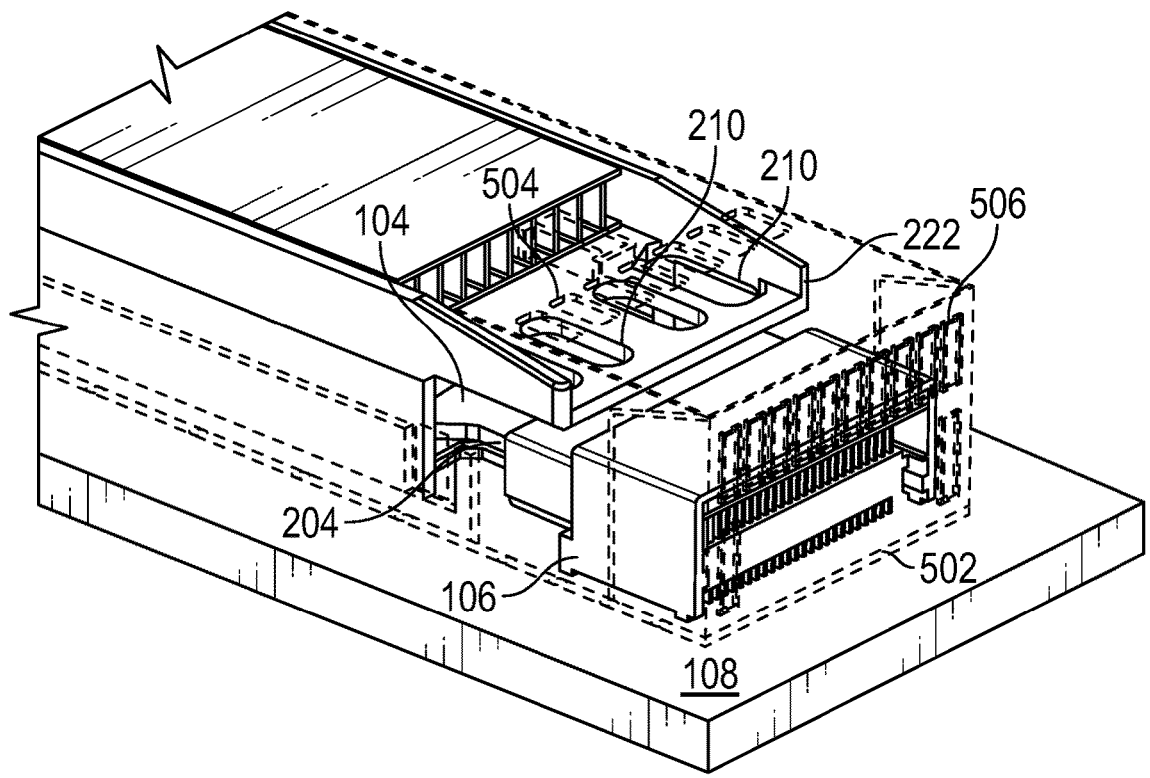
FIG. 5 is a perspective view of one end of the OSFP transceiver module of FIGS. 2-4 plugged into a connector that is attached to a printed circuit board in accordance with some embodiments.

FIG. 5 is a perspective view of one end of the OSFP transceiver module 226 of FIGS. 2-4 plugged into a connector 106 that is attached to a printed circuit board 108. For example, the printed circuit board 108 could be a printed circuit board in a network device such as a network switch or network router, which receives multiple OSFP transceiver modules 226 into multiple connectors 106. The edge connector 202 (not shown) of the printed circuit board 104 is plugged into (i.e., coupled to) the connector 106, with notches 204 of the printed circuit board 104 exposed to direct airflow. Airflow is directed through the apertures 210 in the upper lip 222, and out of the OSFP transceiver module 226 through apertures 504, 506 in the top portion and the end portion of a housing 502 (shown in ghost view) or cage for the connector 106. To engage and couple to the connector 106, the OSFP module 226 is slid into the housing 502 for the connector 106, and pressed until the end connector 202 of the OSFP transceiver module 226 (and printed circuit board 104) is seated in the connector 106 in some embodiments. Generally, the network device (e.g., a host) has exhaust fans that pull airflows through or past the OSFP transceiver module(s) 226 and out of the chassis of the network device. By having the apertures 210 (or notches in further embodiments) in the upper lip 222 aligned with or in spaced apart relation to the notches 204 (or apertures in further embodiments) in the OSFP module printed circuit board 104, airflow management for the lower heat sink 302 is coordinated with airflow management for the upper heat sink 212 and airflow management for the network device. It should be appreciated that the OSFP module 226 may be disposed in one or more cages disposed in a network device and the cages may be housed within in one or more bays of the chassis of the network device.

Figure 6:
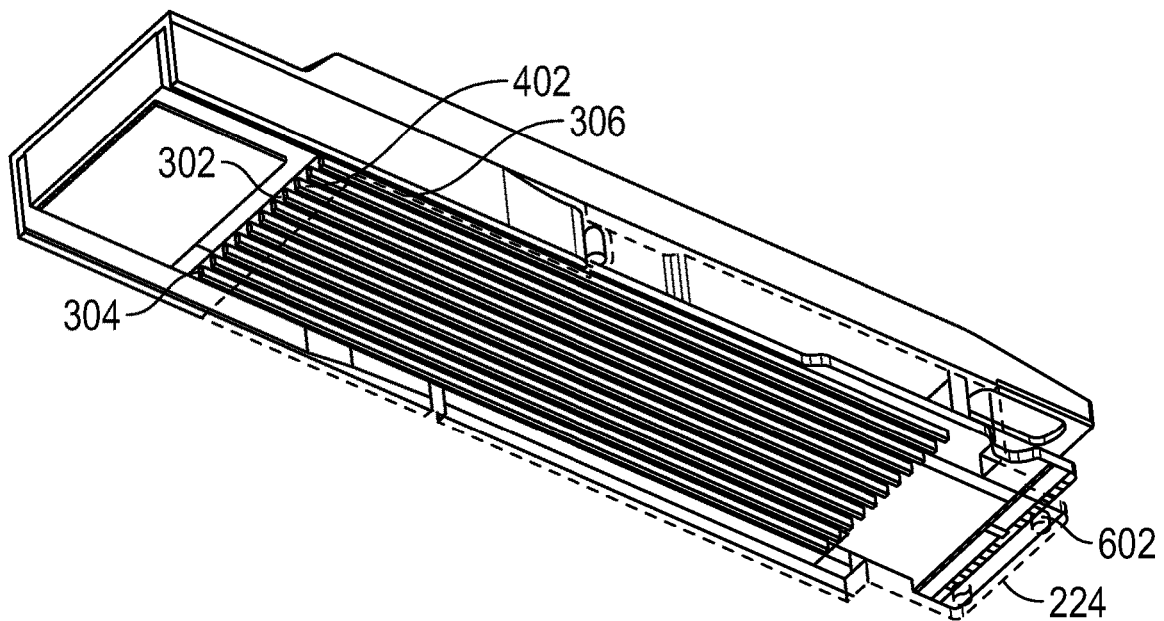
FIG. 6 is a perspective bottom view of the OSFP transceiver module of FIGS. 2-5, showing the bottom airflow inlet and with a ghost view of a bottom cover for the lower heat sink in accordance with some embodiments.

FIG. 6 is a perspective bottom view of the OSFP transceiver module 226 of FIGS. 2-5, showing the bottom airflow inlet 402 and with a ghost view of a bottom cover 306 for the lower heat sink 302. Fins 304 of the lower heat sink 302 are visible through the bottom airflow inlet 402. In some embodiments, one or more apertures 602 or depressions in the lower front lip 224 engage a detent (e.g., a ball and spring detent) when the OSFP transceiver module 226 is coupled to the connector 106. Alternatively, the aperture 602 accepts a fastener for securing the OSFP transceiver module 226, e.g., to the printed circuit board 108, a cage, a housing, or other member of the network device to which the OSFP transceiver module 226 is coupled.

Figure 7:
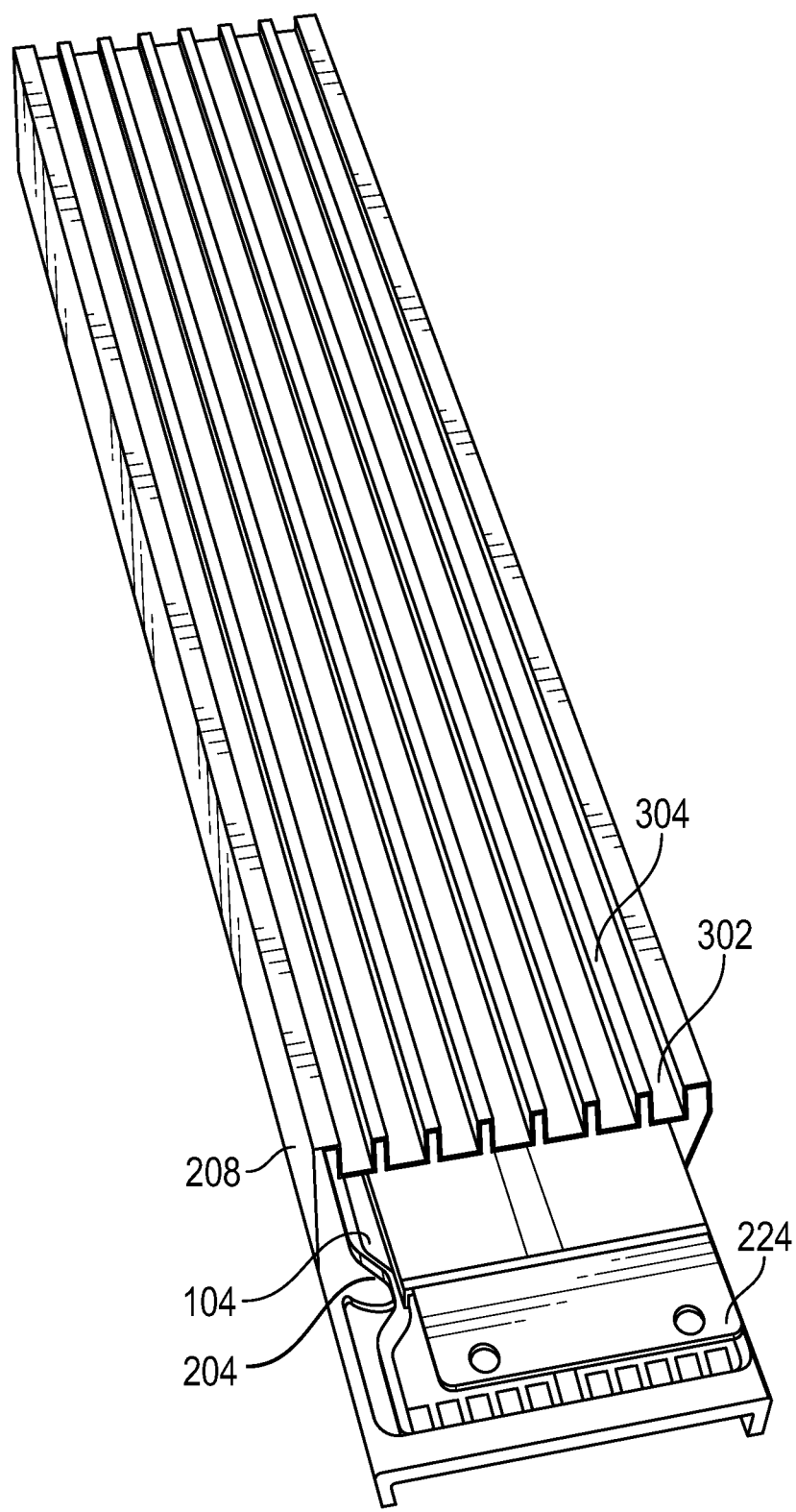
FIG. 7 is a further embodiment of the OSFP transceiver module, with integral lower heat sink in accordance with some embodiments.

FIG. 7 is a further embodiment of the OSFP transceiver module 226, with integral lower heat sink 302. In this embodiment, seen from the bottom of the OSFP transceiver module 226, the heat sink 302, fins 304 of the heat sink 302, lower housing 208 and lower front lip 224 are formed as a unitary monolithic body, for example through extrusion, molding, machining, etc. Thicker fins 304 are likely more durable than thinner fins, and may not need a cover 306. Thinner, and possibly more numerous fins may have better thermal efficiency and benefit from protection by a cover 306. FIG. 7 is not meant to be limiting as numerous heat sink configurations may be incorporated with the embodiments.

Figure 8:
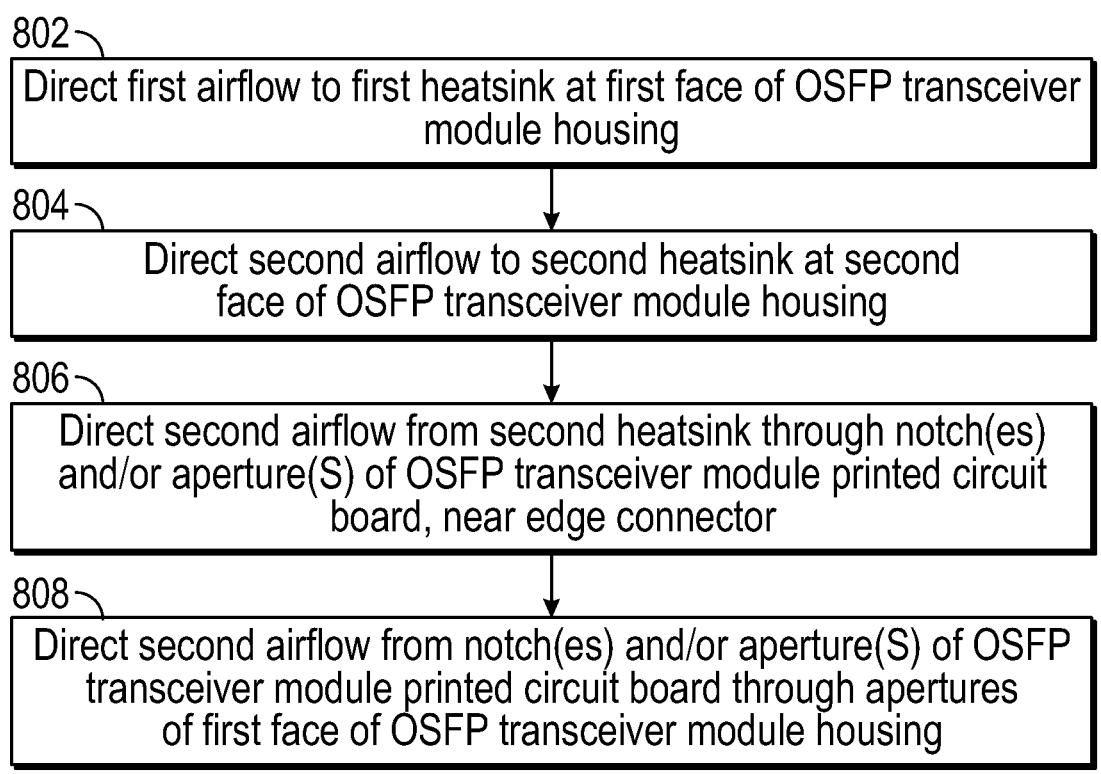
FIG. 8 is a flow diagram of a method of managing airflow for a transceiver module, which can be practiced by or using embodiments of the transceiver module of FIGS. 2-7, or variations thereof.

FIG. 8 is a flow diagram of a method of managing airflow for a transceiver module, which can be practiced by or using embodiments of the transceiver module of FIGS. 2-7, or variations thereof. The flow diagram is directed to an embodiment of the OSFP transceiver module, and is readily adapted to other transceiver modules or other electronics modules with embodiments of the lower heat sink and airflow management. In an action 802, a first airflow is directed to a first heat sink. The first heat sink is disposed along a first surface of an OSFP transceiver module housing, for example as shown in FIGS. 2-5. In an action 804, a second airflow is directed to a second heat sink. The second heat sink is disposed along a second surface of the OSFP transceiver module housing, for example as shown in FIGS. 3, 4, 6 and 7. The second surface of the OSFP transceiver module housing is facing towards a printed circuit board to which a connector is attached, and the OSFP transceiver module is coupled to the connector, for example as shown in FIG. 5.

Still referring to FIG. 8, in an action 806, the second airflow is directed from the second heat sink through one or more notches and/or apertures of an OSFP transceiver module printed circuit board. The notches and/or apertures are near an edge connector of the OSFP transceiver module. That is, the notches and/or apertures are disposed on opposing edges of a portion of a printed circuit board that is not enclosed by a body of the housing as the portion of the printed circuit board is outside or external to the housing body. In an action 808, the second airflow is directed from the notch(es) and/or aperture(s) of the OSFP transceiver module printed circuit board through one or more apertures defined in a portion of the first surface of the OSFP transceiver module housing. The second airflow can exhaust over a surface of the connector along with the first airflow. In some embodiments, the first surface of the OSFP transceiver module housing is shortened (e.g., lacks the upper front lip 222), and apertures are not required in the first surface of the OSFP transceiver module housing. A variation action 808 has the second airflow directed past an edge of the first surface of the OSFP transceiver module housing.

Detailed illustrative embodiments are disclosed herein. However, specific functional details disclosed herein are merely representative for purposes of describing embodiments. Embodiments may, however, be embodied in many alternate forms and should not be construed as limited to only the embodiments set forth herein. It should be appreciated that descriptions of direction and orientation are for convenience of interpretation, and the apparatus is not limited as to orientation with respect to gravity. In other words, the apparatus could be mounted upside down, right side up, diagonally, vertically, horizontally, etc., and the descriptions of direction and orientation are relative to portions of the apparatus itself, and not absolute.

It should be understood that although the terms first, second, etc. may be used herein to describe various steps or calculations, these steps or calculations should not be limited by these terms. These terms are only used to distinguish one step or calculation from another. For example, a first calculation could be termed a second calculation, and, similarly, a second step could be termed a first step, without departing from the scope of this disclosure. As used herein, the term "and/or" and the "/" symbol includes any and all combinations of one or more of the associated listed items.

As used herein, the singular forms "a", "an" and "the" are intended to include the plural forms as well, unless the context clearly indicates otherwise. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof. Therefore, the terminology used herein is for the purpose of describing particular embodiments only and is not intended to be limiting.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Although the method operations were described in a specific order, it should be understood that other operations may be performed in between described operations, described operations may be adjusted so that they occur at slightly different times or the described operations may be distributed in a system which allows the occurrence of the processing operations at various intervals associated with the processing.

Various units, circuits, or other components may be described or claimed as "configured to" perform a task or tasks. In such contexts, the phrase "configured to" is used to connote structure by indicating that the units/circuits/components include structure (e.g., circuitry or mechanical features) that performs the task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. 112, sixth paragraph, for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits or manufactured articles) that are adapted to implement or perform one or more tasks, or designing an article or apparatus to have certain features or capabilities.

The foregoing description, for the purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the embodiments and its practical applications, to thereby enable others skilled in the art to best utilize the embodiments and various modifications as may be suited to the particular use contemplated. Accordingly, the present embodiments are to be considered as illustrative and not restrictive, and the invention is not to be limited to the details given herein, but may be modified within the scope and equivalents of the appended claims.

What is claimed is:

1. An electronics module, comprising:
   a housing enclosing a first printed circuit board to electrically couple the electronics module to an external electrical connector attached to a second printed circuit board;
   a first heat sink disposed along a first surface of the housing;
   a first airflow channel defined along a surface of the first heat sink to pass a first airflow through the first heat sink and over a first surface of the external electrical connector;
   a second heat sink disposed along a second surface of the housing;
   a second airflow channel defined along a surface of the second heat sink along the second surface of the housing to pass a second airflow through the second heat sink;
   one or more notches or apertures of the first printed circuit board proximate to the external electrical connector; and
   one or more apertures arranged in the first surface of the housing, the one or more apertures arranged in the first surface of the housing and the one or more notches or apertures of the first printed circuit board enabling the second airflow through the second heat sink to pass over the first surface of the external electrical connector.

2. The electronics module with airflow management of claim 1, wherein the electronics module comprises an OSFP (octal small form factor pluggable) module, and wherein the first surface and the second surface are opposing surfaces of the housing.

3. The electronics module with airflow management of claim 1, wherein the one or more notches are defined along opposing edges of a portion of the printed circuit board extending outside the housing.

4. The electronics module with airflow management of claim 1, wherein the one or more apertures are defined in a portion of the first surface disposed above a portion of the printed circuit board extending outside the housing.

5. The electronics module with airflow management of claim 1, further comprising:
   one or more further heat sinks at one or more sides of the housing.

6. The electronics module with airflow management of claim 1, wherein:
   the housing comprises a first housing member having the first surface and a second housing member having the second surface;
   the first heat sink is integral with the first housing member; and
   the second heat sink is bonded to the second housing member.

7. The electronics module with airflow management of claim 1, wherein the one or more notches or apertures of the first printed circuit board are aligned with the one or more apertures arranged in the first surface of the housing.

8. A transceiver module with airflow management, comprising:
   a housing containing electronic components;

a printed circuit board having an edge connector, the edge connector dimensioned to couple to an external connector mounted to a further printed circuit board, the printed circuit board partially enclosed within the housing;

a first heat sink disposed along a first surface of the housing, the first heat sink arranged to receive a first airflow;

a second heat sink disposed along a second surface of the housing, the second heat sink arranged to receive a second airflow, wherein the first surface and the second surfaces are opposing surfaces of the housing; and the printed circuit board having one or more notches or apertures proximate to the edge connector and arranged to direct the second airflow over a surface of the external connector mounted to the further printed circuit board.

9. The transceiver module with airflow management of claim 8, further comprising:

a portion of the first surface of the housing having one or more apertures in spaced apart relation to the one or more notches or apertures of the printed circuit board and arranged to pass the second airflow over the surface of the external connector.

10. The transceiver module with airflow management of claim 9, wherein the one or more apertures in spaced apart relation are defined in the portion of the first surface disposed above a portion of the printed circuit board extending outside the housing.

11. The transceiver module with airflow management of claim 8, wherein the transceiver module comprises an OSFP (octal small form factor pluggable) module.

12. The transceiver module with airflow management of claim 8, wherein the one or more notches are defined along opposing edges of a portion of the printed circuit board extending outside the housing.

13. The transceiver module with airflow management of claim 8, wherein the housing and the second heat sink further comprise:

a first housing member;

a second housing member; and the second heat sink having fins, the second heat sink bonded to the second housing member to form a channel for the second airflow between the second heat sink and the second surface of the housing.

14. The transceiver module with airflow management of claim 8, further comprising:

further heat sinks on sides of the housing.

15. A method of managing airflow for an OSFP (octal small form factor pluggable) transceiver module, the method comprising:

directing a first airflow over a first heat sink that is disposed along a first surface of a housing of the OSFP transceiver module;

directing a second airflow to a first end of a second heat sink that is disposed along a second surface of the housing of the OSFP transceiver module, with an edge connector of a first printed circuit board of the OSFP transceiver coupled to a connector that is attached to an external second printed circuit board;

directing the second airflow from a second end of the second heat sink through one or more notches of the first printed circuit board; and directing the second airflow from the one or more notches of the first printed circuit board over a surface of the connector that is attached to the external second printed circuit board.

16. The method of claim 15, wherein the directing the second airflow from the one or more notches or apertures further comprises:

directing the second airflow through one or more notches or apertures of a portion of the first surface of the housing, the one or more notches or apertures of the portion of the first surface of the housing disposed over a portion of the first printed circuit board proximate to the edge connector.

17. The method of claim 16, wherein the first airflow combines with the second airflow downstream from the one or more notches or apertures of a portion of the first surface of the housing.

18. The method of claim 15, further comprising:

directing the second airflow between a cover mounted to or integral with the second heat sink and fins or pins of the second heat sink and wherein the first printed circuit board is partially enclosed by the housing.

19. The method of claim 15, wherein the one or more notches are defined along opposing edges of a portion of the first printed circuit board extending outside the housing.

20. The method of claim 15, further comprising:

directing the second airflow through a channel formed by the second heat sink and the second surface of the housing, past heat sink fins in the channel.

* * * * *